(12) United States Patent
Bourdelle et al.

(10) Patent No.: US 7,575,988 B2
(45) Date of Patent: Aug. 18, 2009

(54) METHOD OF FABRICATING A HYBRID SUBSTRATE

(75) Inventors: Konstantin Bourdelle, Crolle (FR); Carlos Mazure, Bernin (FR); Olivier Rayssac, Grenoble (FR); Pierre Rayssac, legal representative, Clairvaux d' Aveyron (FR); Gisèle Rayssac, legal representative, Clairvaux d' Aveyron (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 209 days.

(21) Appl. No.: 11/832,431

(22) Filed: Aug. 1, 2007

(65) Prior Publication Data

US 2008/0014714 A1 Jan. 17, 2008

Related U.S. Application Data

(63) Continuation-in-part of application No. 11/624,070, filed on Jan. 17, 2007.

(30) Foreign Application Priority Data

Jul. 11, 2006 (FR) .................................. 06 06311
Mar. 20, 2007 (FR) .................................. 07 02004

(51) Int. Cl.
*H01L 21/4763* (2006.01)

(52) U.S. Cl. ...................... 438/518; 438/455; 438/458; 438/522; 438/530; 257/E21.088; 257/E21.122; 257/E21.237; 257/E21.561; 257/E21.568

(58) Field of Classification Search ................ 438/455, 438/458, 471, 518, 522, 530; 257/E21.034, 257/88, 122, 143, 237, 335, 561, 568, 601
See application file for complete search history.

(56) References Cited

U.S. PATENT DOCUMENTS 4,878,957 A 11/1989 Yamaguchi et al. ........ 148/33.3

(Continued)

FOREIGN PATENT DOCUMENTS

EP 0 335 741 A2 10/1989

(Continued)

OTHER PUBLICATIONS

Bäcklund et al., "Bond-Strength Measurements Related to Silicon Surface Hydrophilicity," J. Electrochem. Soc., 139(8): 2299-2301 (1992).

(Continued)

*Primary Examiner*—Michael S Lebentritt
(74) *Attorney, Agent, or Firm*—Winston & Strawn LLP

(57) ABSTRACT

A method of fabricating a hybrid substrate by direct bonding of donor and receiver substrates where each substrate has a respective front face and surface, with the front face of the receiver substrate having a semiconductor material near the surface, and the donor substrate including a zone of weakness that defines a layer to be transferred. The method includes preparing the substrate surfaces by exposing the surface of the receiver substrate to a temperature from about 900° C. to about 1200° C. in an inert atmosphere for at least 30 sec; directly bonding together the front faces of the prepared substrates to form a composite substrate; heat treating the composite substrate to increase bonding strength between the front surfaces of the donor and receiver substrates; and transferring the layer from the donor substrate by detaching the remainder of the donor substrate at the zone of weakness.

13 Claims, 5 Drawing Sheets

U.S. PATENT DOCUMENTS

| | | | | |
|---|---|---|---|---|
| 5,421,953 | A | | 6/1995 | Nagakubo et al. ............. 216/34 |
| 5,451,547 | A | | 9/1995 | Himi et al. .................. 437/225 |
| 6,010,579 | A | * | 1/2000 | Henley et al. ............. 148/33.2 |
| 6,048,411 | A | * | 4/2000 | Henley et al. ............. 148/33.5 |
| 6,146,979 | A | * | 11/2000 | Henley et al. ............. 438/458 |
| 6,245,161 | B1 | * | 6/2001 | Henley et al. ............. 148/33.4 |
| 6,251,754 | B1 | | 6/2001 | Ohshima et al. ............ 438/506 |
| 6,323,108 | B1 | * | 11/2001 | Kub et al. .................. 438/458 |
| 6,461,939 | B1 | | 10/2002 | Furihata et al. ............. 438/459 |
| 6,500,732 | B1 | * | 12/2002 | Henley et al. ............. 438/459 |
| 6,534,380 | B1 | * | 3/2003 | Yamauchi et al. ........... 438/455 |
| 6,696,352 | B1 | * | 2/2004 | Carr et al. .................. 438/458 |
| 6,806,171 | B1 | * | 10/2004 | Ulyashin et al. ............ 438/492 |
| 7,056,815 | B1 | * | 6/2006 | Weng et al. ................ 438/518 |
| 7,396,734 | B2 | * | 7/2008 | Moriwaki ................... 438/406 |
| 2001/0041423 | A1 | | 11/2001 | Nishida et al. ............. 438/455 |
| 2002/0113265 | A1 | | 8/2002 | Falster ........................ 257/347 |
| 2002/0187619 | A1 | * | 12/2002 | Kleinhenz et al. ........... 438/471 |
| 2003/0153163 | A1 | | 8/2003 | Letertre et al. ............. 438/458 |
| 2006/0208341 | A1 | | 9/2006 | Atwater, Jr. et al. ......... 257/616 |

FOREIGN PATENT DOCUMENTS

| | | |
|---|---|---|
| EP | 1 100 127 A1 | 5/2001 |
| EP | 1324385 A2 | 7/2003 |

OTHER PUBLICATIONS

Celler et al., "Frontiers of silicon-on-insulator," Journal of Applied Physics, 93(9): 4955-4978 (2003).

J-P Colinge, "Silicon-On-Insulator Technology: Materials to VLSI, 2nd Edition," Kluwer Academic Publishers, pp. 50-51 (1997).

Esser et al., "Improved Low Temperature Hydrophobic Si-Si Bonding Techniques," Electrochemical Society Proceedings, PV 2001-27: 126-135 (2001).

Holl et al., "UV Activation Treatment for Hydrophobic Wafer Bonding," Journal of The Electrochemical Society, 153(7) G613-G616 (2006).

Horning et al., "Wafer-to-Wafer Bond Characterization by Defect Decoration Etching," Second International Symposium on Semi-Conductor Wafer Bonding, 93-29: 199-206 (1993).

Kim et al., "Heterogeneous Silicon Integration by Ultra-High Vacuum Wafer Bonding," Journal of Electronic Materials, 32(8): 849-854 (2003).

Maleville et al., "Detailed Characterization of Wafer Bonding Mechanisms," Electrochemical Society Proceedings, 97-36: 46-55 (1997).

Saenger et al., "Amorphization/templated recrystallization method for changing the orientation of single-crystal silicon: An alternative approach to hybrid orientation substrates," Applied Physics Letters, 87: 221911-1-21911-3 (2005).

Sung et al., "High Performance CMOS Bulk Technology using Direct Silicon Bond (DSB) Mixed Crystal Orientation Substrates," Electron Devices Meeting 2005, IEDM Technical Digest, IEEE International, pp. 225-228 (Dec. 2005).

Tong et al., "Semiconductor Wafer Bonding: Science and Technology," Wiley Interscience Publication, pp. 1-15, 80-99 (1999).

Search Report from French Application No. 0606311 dated Feb. 27, 2007.

International Search Report PCT/IB2008/000567 dated Oct. 14, 2008.

Qin-Yi Tong et al., "Low Temperature Wafer Direct Bonding", Journal Of Microelectromechanical Systems, vol. 3, No. 1, pp. 29-35 (1994).

Taekryong Chung et al.: "InGaAsP Lasers On GaAs Fabricated By The Surface Activated Wafer Direct Bonding Method At Room Temperature", Japanese Journal of Applied Physics, vol. 37, No. 3B, pp. 1405-1407 (1998).

* cited by examiner

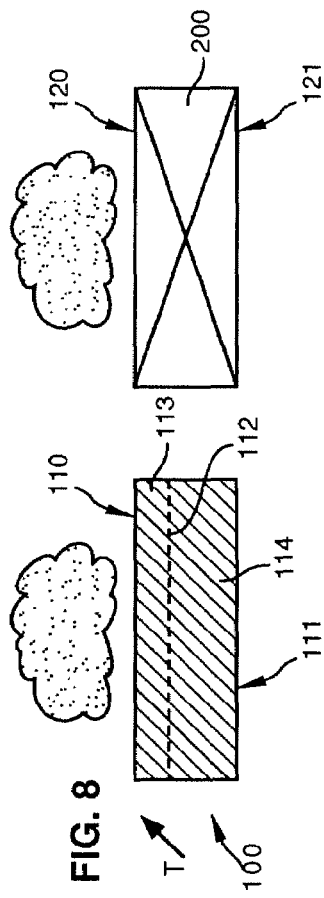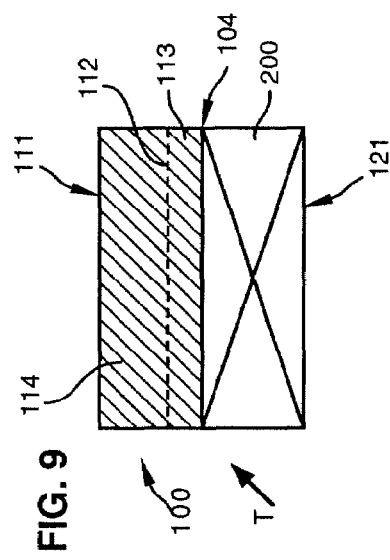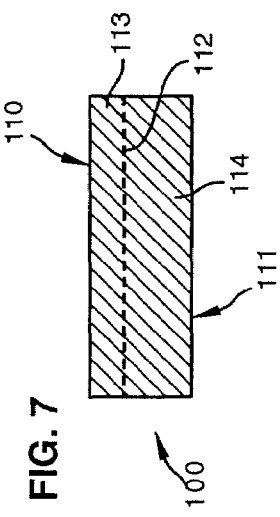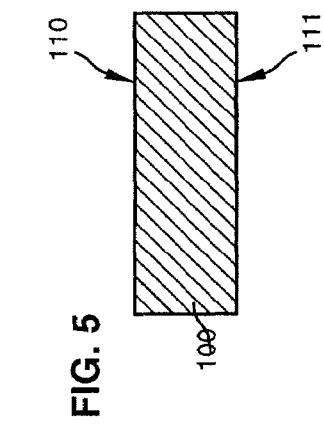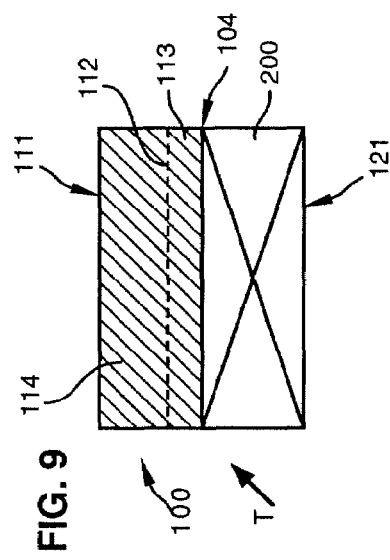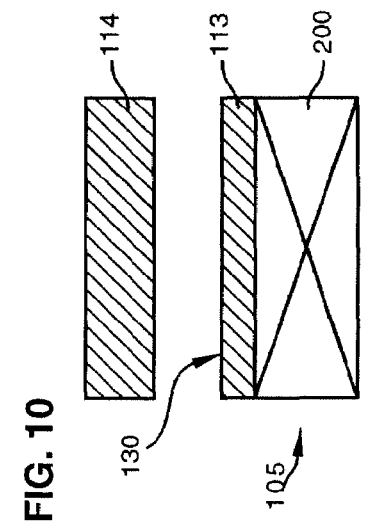

METHOD OF FABRICATING A HYBRID SUBSTRATE

CROSS-REFERENCE TO RELATED APPLICATIONS

This application is a continuation-in-part of application Ser. No. 11/624,070 filed Jan. 17, 2007, the entire content of which is expressly incorporated herein by reference thereto.

BACKGROUND

The present invention relates to methods for fabricating a hybrid substrate for use in electronics, optics, or optoelectronics. In particular, the invention provides methods for direct bonding of two substrates, i.e. molecular bonding without any intermediate layer such as a layer of adhesive, which can be implemented during the fabrication of hybrid substrates. Generally, the hybrid substrate comprises at least two layers of crystalline material that are bonded together by direct bonding.

This type of substrate can be used in the fields of optics, electronics or optoelectronics, these terms also including in general microelectronics, nanoelectronics, optomicroelectronics, optonanoelectronics and component technology. The aforementioned two layers of materials may be of the same or different nature, the term "nature" covering both the chemical nature of the materials and their physicochemical properties and/or their crystalline orientation.

The term "direct bonding" of two layers or two substrates denotes molecular bonding without an intermediate layer, such as an adhesive layer.

Various known methods for fabricating hybrid substrates include steps for bonding donor substrates onto receiver substrates and then for removing a remainder portion of the donor substrate in order leave a transfer layer portion of the donor substrate bonded to the receiver substrate. To improve bonding, an intermediate layer (a bonding layer) is often formed between the donor and receiver substrates. A resulting hybrid substrate then comprises in succession the transfer layer having thicknesses typically between 0.01 micrometers (μm) and a few μm, an intermediate having thicknesses typically between 0.01 μm and 1 μm; and the receiver substrate having thickness typically of several hundreds of μm.

Techniques for removing the remainder (or rear) portion of the donor substrate include grinding and/or chemical etching. Further techniques include, prior to bonding, forming a zone of weakness inside the donor substrate, then removing the remainder portion of the donor substrate by fracturing along the zone of weakness. The zone of weakness can be formed by implanting atomic species, such as hydrogen and/or rare gases, according to techniques known under the trademark of SMART-CUT®. The zone of weakness can also be formed by creating a porous zone according to techniques known under the trademark of ELTRAN®. See, e.g., Celler et al., 2003, Frontiers of Silicon-on-insulator, *J. App. Physics* 93:4955-4978.

Semiconductor-on-insulator (SeOI) substrates, especially silicon-on-insulator (SOI) substrates, can be fabricated by such known methods. During fabrication, an insulating layer is formed on the face of one or both substrates (by, e.g., thermal oxidation or oxide deposition) and it the also serves as a bonding layer when the substrate faces are put together during the bonding step. In the final hybrid substrate, the insulating layer is buried. In such layer transfer techniques, the quality of the resulting hybrid substrate directly depends on the quality of the bonding. A high bonding energy, this is the energy with which two substrates are bonded together, is important during the subsequent step of removing the remainder portion of the donor substrate. Bond energy and bond quality are known to be determined by properties of the substrate bonding surfaces, e.g., by planeness, by particles contaminants, by roughness, and by hydrophilicity.

Bond energy and quality are known to be improved by an intermediate layer (a bonding layer) with sufficient thickness, i.e. greater than 50 nanometers (nm), between two bonding faces of the two substrates. In particular, the bond quality is improved because there are fewer bond defects, e.g. blisters. See, e.g., Q. Y. Tong and U. Gösele, *Semiconductor wafer bonding science and technology*, published by John Wiley & Sons, New York (1999). Thus, the buried insulating layer in SeOI type substrates can serve both to insulate, to facilitate bonding, and to limit bonding defects.

However, in certain applications, any buried insulating layer should be at least limited to thicknesses less than about 50 nm or preferably even eliminated. Such application include those in which a high heat conduction between the transferred layer (in which microelectronic components can be formed) and the receiver substrate is advantageous. Bonding without a buried insulating layer (i.e. direct bonding) can also be advantageous in applications needing improved electrical conduction between the transfer layer and the receiver substrate. Additionally, it can also be advantageous to direct bond a receiver substrate of silicon covered and a transfer layer that is elastically stressed in tension or in compression, e.g., a layer of strained silicon, or of germanium, or of silicon-germanium.

Further, direct bonding can also be advantageous in applications in which the transfer layer and the receiver substrate have different crystal orientations. For example, in complementary metal oxide semiconductor (CMOS) type components, NMOS elements can be fabricated in a (100) silicon layer, while PMOS elements can be fabricated in a (110) silicon layer. See, e.g., K. L. Saenger et al. "Amorphization/templated recrystallization method for changing the orientation of single-crystal silicon: an alternative approach to hybrid orientation substrates", *Appl. Phys. Lett.*, 87, 221911 (2005), and C. Y. Sung et al. "High performance CMOS bulk technology using direct silicon bond (DSB) mixed crystal orientation substrates", *Tech. Dig.—Int. Electron Devices Meet.*, 2005, 236.

Direct bonding techniques are known and include hydrophilic bonding and hydrophobic bonding techniques. Hydrophilic bonding of silicon to silicon includes, prior to placing the substrate bonding surface into intimate contact, hydrophilic cleaning of the bonding surfaces. Hydrophilic cleaning is typically performed by the "RCA" method during which the bonding surfaces are exposed first to standard clean 1 (SC1) solution and then first to standard clean 2 (SC2) solution. SC1 solution comprises a mixture of ammonium hydroxide ($NH_4OH$), hydrogen peroxide ($H_2O_2$), and deionized water; SC2 solution comprises a mixture of hydrochloric acid (HCl), hydrogen peroxide ($H_2O_2$), and deionized water. See, e.g., C. Maleville, O. Rayssac, H. Moriceau et al., in *Proc. 4th Internat. Symposium on Semiconductor Wafer Bonding: PV*97-36, ECS publications, p. 46, 1997.

Hydrophobic bonding of silicon to silicon includes, prior to placing the substrate bonding surfaces into intimate contact, hydrophobic cleaning of the bonding surfaces. Hydrophobic cleaning is typically performed by exposing the bonding surface to a bath of hydrofluoric acid (HF) (known in the art as "HF last" cleaning), or cleaning in HF vapor, or annealing in an ultra-high vacuum (UHV). In the HF last cleaning technique, exposure to a HF bath is usually followed by rather complex rinsing and drying steps. Further, because the surfaces then become reactive to metallic and particle contaminants, special precautions are advantageous to avoid such contamination. See, e.g., M. J. Kim and R. W. Carpenter, "Heterogeneous silicon integration by ultra-high vacuum wafer bonding", *Journal of Electrochemical Materials*, Vol. 32, No. 8, 2003.

However, for the following reasons, it has been difficult to achieve sufficient bond quality in routine commercial or industrial application of known direct bonding techniques such as hydrophilic or hydrophobic bonding. See, e.g., S. L. Holl et al., "UV activation treatment for hydrophobic wafer bonding", *Journal of the Electrochemical Society*, 153 (7), G613-G616 (2006). Hydrophobic bonding using the HF last cleaning technique is rather complex and prone to contamination. UHV annealing requires the use of expensive equipment. Further, to achieve bond strength, both hydrophilic and hydrophobic cleaning techniques are advantageously followed by thermal annealing in the range 200° C. to 1200° C. for a few, e.g. 2, hours (h). But annealing at high temperatures may not be possible for certain subsequent applications. It may even not be advantageous to exceed 200° C.

Also, after annealing in the range 200° C. to 1100° C. bubbles have been observed in both hydrophilic or hydrophobic bonding interfaces by infrared transmission techniques. Such bubbles may be due to desorption of species remaining at the bonding surfaces regardless of the cleaning technique. And, after annealing in the range 1100° C. to 1200° C., bond defects are known to exist even though infrared-visible bubbles are rate or absent. These defects may be observable by the acoustic microscopy technique. See, e.g., R. D. Horning and R. R. Martin, "Wafer-to-wafer bond characterization by defect decoration etching", *Second International Symposium on Semiconductor Wafer Bonding: Science Technology and Applications*, PV 93-29, p 199, 1993.

Methods known for obviating defects observed after direct bonding include, for example, creating trenches to promote escape of desorbed gases or performing a desorption step prior to bonding. However, such methods are not fully satisfactory and are not always suitable if certain types of electronic components are to be fabricated. See, e.g., R. H. Esser, K. D. Hobart, and F. J. Kub, "Improved low temperature Si—Si hydrophilic wafer bonding", *Journal of the Electrochemical Society*, 150(3), G228-G231 (2003). Thus, improvements over these prior art techniques are needed.

Also among these hybrid substrates are those known to a person skilled in the art by the acronym DSB (direct silicon bonding). Such substrates comprise an active silicon layer directly bonded to a receiver substrate made of silicon of a different crystalline orientation, without the formation of an intermediate layer, especially without the formation of a buried oxide layer. Thus, it is possible to produce a substrate comprising a layer of silicon with a (110) crystalline orientation directly bonded to a support of silicon with a (100) crystalline orientation, or vice versa.

When the receiver substrate is made of silicon carbide (SiC), it is possible to fabricate hybrid substrates known to a person skilled in the art by the acronym SopSiC (silicon-on-polycrystalline-SiC). Such hybrid substrates are useful for the production of high-performance microelectronic circuits.

The article by C. Y. Sung, "*Direct Silicon Bonded (DSB) Mixed Orientation Substrate for High Performance Bulk CMOS Technology*", Extended Abstracts of the 2006 International Conference on Solid-State Devices and Materials, Yokohama, 2006, pp. 160-161, cites an example of the fabrication of such a substrate, which consists in transferring a layer of a (110) silicon donor substrate onto a (100) silicon receiver substrate by bonding followed by thinning. This article records that the fabrication of such a substrate does not require any insulating layer between the two layers bonded together.

The above article also mentions that the absence of $SiO_2$ insulating layer in the final structure means that a hydrophobic-type prebonding preparation is preferred to a hydrophilic-type preparation. This is because hydrophilic bonding includes the formation of a thin silicon oxide layer during surface preparation of the layers to be brought into contact with each other, and this oxide, which is buried in the final structure, must be subsequently removed, for example by a final annealing step at very high temperature, thereby complicating the method of fabrication in the present case. However, hydrophobic bonding, which involves hydrogen-terminated bonds, is much more difficult to implement since these H-terminated bonds attract particles that have a negative impact on the bonding.

Also known, from U.S. Pat. No. 6,020,252, is a method of obtaining a thin layer of a semiconductor material from a donor substrate. This method consists in implanting rare-gas or hydrogen ions into a donor substrate, at a predetermined temperature and with a predetermined implantation dose, so as to create a weakened zone therein, and then carrying out a heat treatment at a temperature high enough to cause the substrate to separate into two parts on either side of the plane of weakness. In accordance with what is described in that patent, the temperature and implantation dose are chosen so as to create microcavities within the substrate in sufficient quantities to obtain the weakened zone but in insufficient quantities to obtain detachment by the subsequent heat treatment alone. Detachment requires the additional application of a mechanical force. However, this document does not relate specifically to a surface preparation allowing good direct bonding. Thus, improvements in these processes are also desired.

SUMMARY OF THE INVENTION

The invention thus relates to a method of fabricating a hybrid substrate, which comprises at least two layers of crystalline material that are bonded directly to each other, including a layer of material called the "active" layer, coming from a crystalline substrate called a "donor" substrate. According to the method of the invention, a hybrid substrate is formed by direct bonding of donor and receiver substrates suitable for use in electronics, optics, or optoelectronics, with each substrate comprising a respective front face and surface, with the front face of the receiver substrate comprising a semiconductor material at, or in proximity to, the surface, and the donor substrate including a zone of weakness that defines a layer to be transferred from a remainder of the donor substrate. The method comprises preparing the substrate surfaces by exposing at least the surface of the receiver substrate to a temperature from about 900° C. to about 1200° C. in an inert atmosphere for a duration of at least 30 sec; directly bonding together the front faces of the prepared substrates to form a composite substrate; heat treating the composite substrate to increase bonding strength between the front surfaces of the donor and receiver substrates; and transferring the layer from the donor substrate by detaching the remainder of the donor substrate at the zone of weakness to form the hybrid substrate.

The invention also provides methods enabling two substrates to be bonded directly one against the other without any additional bonding layer, where at least one of the substrates comprises a layer of semiconductor material on one of its faces or in the proximity thereof, and for this to be done with quality that is satisfactory and without macroscopic bonding defects such as bubbles appearing. In particular, the invention relates to methods of direct bonding of so "front" (or bonding) faces of two substrates for use in applications in the fields of electronics, optics, or optoelectronics. Preferably, at least one of the two substrates, which is referred to as the "substrate comprising a semiconductor", comprises a layer of semiconductor material that extends over its front face or in the proximity thereof.

These methods make possible the elimination of the native oxide present on the treated surface and also make possible the passivation of the surface by means of hydrogen atoms. Contrary to the state of the art, the method can be used with good results, even if the substrates do not have an insulating layer, or if they do have an insulating layer, it has a thickness of less than about 50 nm. In addition, the preparation treatment prior to bonding makes it possible to obtain very low levels of roughness. It has been possible to measure root mean square (rms) roughness of 0.7 angstroms (Å) on a scanned 2 µm by 2 µm sample, whereas the surface of a silicon substrate typically presents rms roughness of the order of 2 Å. The usual surface preparation treatments prior to bonding (such as SC1 type cleaning) tend to make the surface even rougher. The invention thus presents the additional advantage of putting into contact surfaces that present very little roughness.

In preferred embodiments, the provided methods comprise the steps of subjecting at least the front face of the substrate that comprises a semiconductor, or at least one of the front faces of both substrates if both substrates comprise a semiconductor, to heat treatment referred to as "preparation treatment prior to bonding", at a temperature lying in the range 900° C. to 1200° C., in a gaseous atmosphere comprising hydrogen and/or argon, for a duration of at least 30 seconds (s); and then bonding directly together the respective front faces of the two substrates.

Advantageous and non-limiting aspects of the invention include, singly or in combination, that the preparation treatment prior to bonding is performed in a gaseous atmosphere containing argon exclusively or containing hydrogen exclusively; and that the preparation treatment prior to bonding is performed in a rapid thermal annealing (RTA) type chamber or in a conventional chamber or in an epitaxy chamber; and that the direct bonding is performed immediately after the preparation treatment prior to bonding; and that the substrate(s) subjected to the preparation treatment prior to bonding is/are stored temporarily in a chamber under a controlled inert gas atmosphere prior to direct bonding; and that after direct bonding, a bonding consolidation heat treatment is performed at a temperature lying in the range 200° C. to 1200° C., for about at least one hour and preferably for less than three hours; and that both substrates for bonding comprise a semiconductor, and the front faces of the both substrates are subjected to the preparation treatment prior to bonding; and that the semiconductor material is selected from (100) silicon, (110) silicon, and (111) silicon.

In further preferred embodiments, the provided methods include the steps of selecting a "receiver" substrate having one of its faces referred to as a "front" (or bonding) face; selecting a "donor" substrate that comprises a layer of material for transfer, and another portion referred to as the "remainder", the layer for transfer extending over one of the faces of the donor substrate, referred to as its "front" face, where at least one of the receiver and donor substrates comprising a layer of semiconductor material extending over its front face or in the proximity thereof; proceeding with the above described preparation and direct bonding steps of the two respective front faces of the donor substrate and of the receiver substrate; and removing the remainder from the donor substrate in order to obtain the hybrid substrate comprising the receiver substrate and the transferred layer.

Further advantageous and non-limiting aspects of the invention include, singly or in combination, that at least one of the donor and receiver substrates comprises a layer of insulating material on the layer of semiconductor material; and that layer of insulating material extends over the front face of the substrate; and that the layer of insulating material has a thickness less than or equal to about 50 nm; and that the layer of insulating material is a layer of native oxide; and that the remainder of the donor substrate is removed by mechanical and/or chemical thinning; and that prior to the direct bonding, a zone of weakness is formed inside the donor substrate, and at least a portion of the remainder of the donor substrate is removed along the zone of weakness by applying mechanical, chemical, and/or thermal stresses; and that the zone of weakness is formed by implanting atomic species; and that if the receiver substrate comprises a layer of semiconductor material, only the receiver substrate is subjected to the preparation treatment prior to bonding; and that the zone of weakness is a porous zone.

Additionally, the method can include the following successive steps:

carrying out a step of implanting at least one category of atomic and/or ionic species into the donor substrate so as to form therein a weakened zone forming the boundary between the active layer and the remainder of the donor substrate;

subjecting one of the faces called the "front" face of the donor substrate and one of the faces called the "front" face of a crystalline substrate, called a "receiver" substrate, to a heat treatment, called "prebonding preparation" heat treatment, at a temperature between 800° C. and 1200° C., in a gaseous atmosphere comprising hydrogen and/or argon for a time of at least 30 seconds, so as to make the front faces hydrophobic;

directly bonding the front faces to each other;

carrying out a heat treatment of the two substrates under conditions for obtaining strong bonding between them; and detaching the remainder along the weakened zone by a purely mechanical action, the nature, implantation dose and implantation energy of the atomic and/or ionic species being chosen so that the defects induced by these species within the donor substrate allow the remainder of the donor substrate to be subsequently detached but do not develop sufficiently during the prebonding preparation heat treatment to prevent the subsequent bonding or to deform the front face of the donor substrate.

According to other advantageous and non limiting features of the invention, taken individually or in combination:

the prebonding preparation treatment is carried out in a gaseous atmosphere containing exclusively argon;

the prebonding preparation treatment is carried out in a gaseous atmosphere containing exclusively hydrogen;

the prebonding preparation treatment is carried out in a rapid thermal annealing (RTP) furnace;

the heat treatment to strengthen the bonding of the two substrates is carried out by a long heat treatment for at least 2 hours at a temperature of 1100° C. or higher;

the species implanted to form the weakened zone are chosen from hydrogen, helium, fluorine, neon, argon, krypton and xenon;

the active layer of the donor substrate consists of a material chosen from silicon (Si), (110) silicon, (100) silicon, silicon-germanium (SiGe), germanium (Ge), silicon carbide (SiC) and gallium nitride (GaN); and the receiver substrate consists at least partly of a material chosen from silicon (Si),s (110) silicon, (100) silicon and silicon carbide (SiC).

Other characteristics and advantages of the invention appear from the following description given with reference to the accompanying drawings which show one possible implementation by way of non-limiting indication. Further aspects and details and alternate combinations of the elements of this invention that are apparent from the following detailed description and are also within the scope of the present invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which:

FIGS. 5 to 10 illustrate the successive steps in the method of fabrication according to another embodiment of the invention.

DETAILED DESCRIPTION OF THE PREFERRED EMBODIMENTS

Figure 1A:
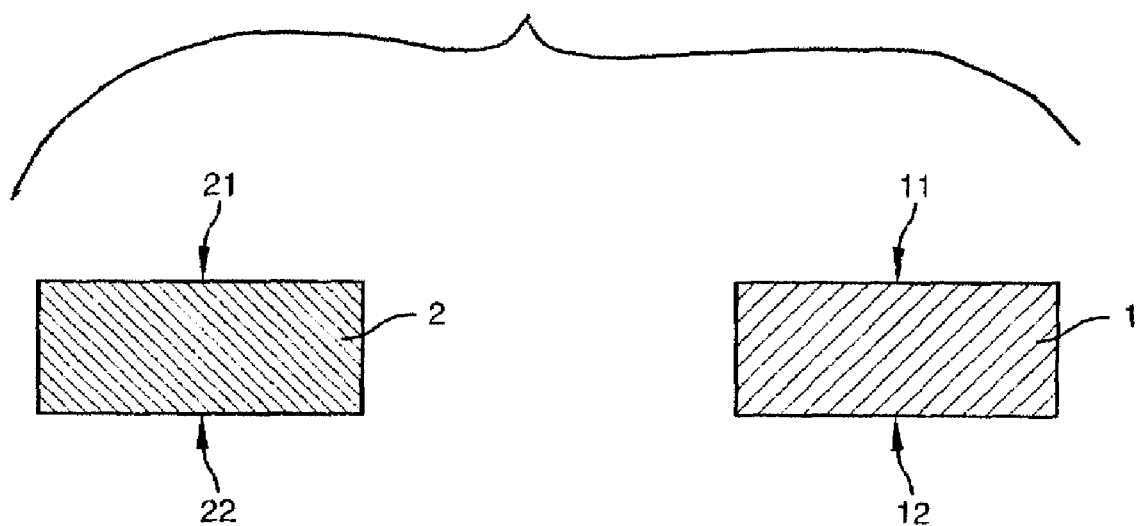
FIGS. 1A to 1C illustrate the various steps of a method of fabricating a hybrid substrate according to the invention.

The invention provides methods for directly bonding a donor substrate on a receiver substrate. Generally, the term "direct bonding" is used herein to refer to bonding without an intermediate bonding layer, or with an intermediate bonding layer having a thickness less than about 50 nm. Headings are used herein for clarity only and without any intended limitation.

In particular, the present method relates to the direct bonding of two substrates suitable for use in electronics, optics, or optoelectronics, with each substrate comprising a respective front face and surface, with the front face of a first substrate comprising a semiconductor material at, or in proximity to, the surface, This method preferably comprises preparing the substrate surfaces by exposing at least the surface of the first substrate to a temperature from about 900° C. to about 1200° C. in an inert atmosphere for a duration of at least 30 sec; and directly bonding together the front faces of the prepared substrates.

Another embodiment relates to a method for fabricating a hybrid substrate suitable for use in electronics, optics, or optoelectronics, by providing a receiver substrate having a front face and a donor substrate having a front face, the donor substrate comprising a portion for transfer and a remainder portion, the portion for transfer extending over the front face, and wherein the front face of at least one of the substrates comprises a semiconductor material at, or in proximity to, the surface of the front face; preparing the substrates by exposing at least the substrate comprising the semiconductor material to a temperature from about 900° C. to about 1200° C. in an inert atmosphere for a duration of at least 30 sec; directly bonding together the front faces of the prepared substrates; and removing the remainder portion of the donor substrate from the bonded substrates thereby obtaining a hybrid substrate comprising the receiver substrate and the transferred portion of the donor substrate.

In the figures, the receiver (donor) substrate has reference number 1 (2). The face of the donor substrate that is to come into contact with the donor substrate, the front or bonding face, has reference number 11; the face that is generally parallel to and opposed to the front face, the rear face, has reference number 12. Similarly, the receiver substrate 2 has front face or bonding 21 and rear face 22. The donor substrate 2 and the receiver substrate 1 may be single-layer or multi-layer substrates.

At least one of the donor or receiver substrates, 2 or 1, comprises a layer of semiconductor material (or a semiconductor layer). Thus, the other substrate can comprise a non-semiconductor material, e.g., an insulating material such as sapphire or other oxide. Semiconductor materials are those that are generally used in the field of microelectronics, namely, for example, (100) silicon, (110) silicon, or (111) silicon (the numerals denoting crystallographic types), germanium, GaAs, GaN, and so forth. A substrate "comprises a layer of semiconductor material (or a semiconductor layer)" if it is a single-layer substrate of the semiconductor material, or if it is a multilayer substrate having at least one layer is of the semiconductor material.

Further, if the substrate is a multilayer substrate, then the layer of semiconductor material (or semiconductor layer) extends along the front face of the substrate or in the proximity thereof. A semiconductor layer "extends along the front face" if it is at the surface of the front face. A semiconductor layer is "in the proximity of the front face" if it either extends along the front face, or is overlain by an insulating surface layer of thickness less than about 50 nm, or less than about 20 nm, or preferably less than about 10 nm. The insulating layer can include oxide layer, which can have a thickness down to less than of a few Å (1 nm=10 Å) in the case of a native oxide layer (which can only a Å few thick). Similarly, a single-layer substrate of semiconductor material may also be covered by a surface insulating layer of similar thickness.

The invention comprises exposing the substrate comprising a semiconductor layer to a selected heat treatment, or if both substrates comprise a semiconductor layer, then exposing both substrates to the heat treatment. Thus, at least one of the faces to be bonded, that is, at least one of the front faces 11 and/or 21, are exposed to the heat treatment. The selected heat treatment is at a temperature between about 900° C. and about 1200° C. in an atmosphere comprising hydrogen gas and/or an inert gas such argon gas or nitrogen gas, but substantially no oxygen gas. For example, the gaseous atmosphere may comprise: exclusively hydrogen; or exclusively an inert gas, preferably argon but also nitrogen or other inert gas; or a mixture of hydrogen and an inert gas; or hydrogen or inert gas associated with another other gas other than oxygen. The selected heat treatment is performed for a duration of at least 30 s, and preferably not more than a few minutes (min), e.g., not more than 1 min, or not more than 5 min, or not more than 10 min.

The hydrogen and/or argon (or inert gas) is believed to eliminate substantially all of any native oxide present on the front face(s), and also to passivate the front face(s) with hydrogen atoms. The hydrogen and/or argon (or inert gas) is also believed to reduce the surface roughness to very small values and to make the treated surfaces hydrophobic. The latter effect has been demonstrated by measuring the contact angle of a drop of water with a treated surface. The result was about 80°, which was considerably greater than the contact angle (typically 70°) after an HF last treatment. See, e.g., Y. Bäcklünd, Karin Hermasson, L. Smith, "Bond-strength measurements related to silicon surface hydrophilicity", *J. Electrochem. Soc.*, Vol. 1398, No. 8, 1992. It is known in that art that the larger the contact angle of drop of water makes with a surface, then the higher is the degree of hydrophobicity of the surface. Thus, surfaces treated according to the invention can be more hydrophobic than surface treated according to an HF last cleaning.

It is further believed that substantially no species except for hydrogen (or, generally, no species capable of causing blisters and similar bonding defects) remains adsorbed on the surface after the selected heat treatment. Hydrogen atoms thus do not generate degassing defects (e.g., blisters), because, since hydrogen atoms are very small, on being desorbed during bonding (e.g., to create covalent bonds between the front faces 11 and 12), they are not trapped at the interface, but instead diffuse into the substrate material.

An advantage of the invention is that is easier to implement than prior methods. The methods of the invention involve only dry treatments, and can be entirely implemented in any chambers that enable the dry selected heat treatment. Such chambers include, for example, single-plate rapid thermal annealing (RTA) type chambers, or epitaxy chambers, or traditional chambers suitable for processing batches of substrates. In contrast, the known methods of hydrophilic or hydrophobic cleaning are more difficult to implement. These methods require wet treatment in cleaning baths with subsequent drying. It has also been observed that bonding faces prepared in according to the invention are much less reactive than are bonding faces prepared by the HF last cleaning. Thus, particle contamination of the bonding faces of the invention is limited such surfaces, which further promotes commercial application of the invention.

After the selected heat treatment, the bonding faces must be quickly brought into intimate contact for bonding in order to minimize any contamination from the ambient atmosphere or other sources. This bonding step is shown in FIGS. 1B, 2B, 3B, and 4B. However, treated substrates can be stored in a chamber having an inert atmosphere, preferably argon or nitrogen or a mixture thereof, in which case it is possible to wait a longer time before the donor and receiver substrates 2 and 1 are bonded together.

Advantageously, after bonding, the bonded substrates can optionally be annealed to reinforce bonding. Such pre-consolidation or consolidation annealing includes exposure to a temperature between about 200° C. and about 1200° C., preferably at least approximately 1100° C. if it is desired to consolidate the interface entirely. The pre-consolidation or consolidation annealing has a duration of preferably at least one about hour but preferably less than about three hours. This pre-consolidation or consolidation heat treatment takes place without bubbles forming, thereby ensuring good bonding energy at all locations of the bonding interface.

The direct bonding methods of the invention can be implemented as part of existing methods of fabricating hybrid substrates. For example, a combined fabrication method might include: selecting a donor substrate 2 and a receiver substrate 1 with the described properties; performing the selected heat treatment and bonding steps as described; and removing a portion of the donor substrate, referred to herein as "the remainder", so as to obtain a hybrid substrate that comprises the receiver substrate 1 with a portion of the donor substrate, referred to herein as the "transferred layer", bonded thereto.

Figure 1B:
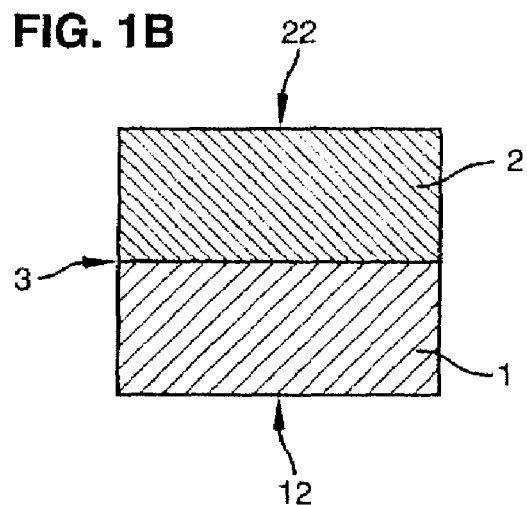
Figure 1C:
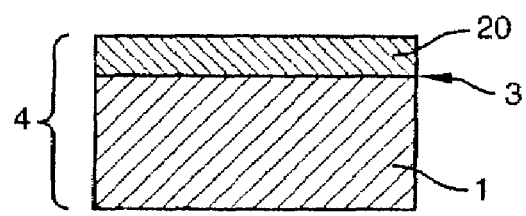

FIGS. 1A to 1C illustrate a preferred embodiment of fabricating hybrid substrate 4 from donor substrate 2 and receiver substrate 1 both of which are single-layer substrates. First, the selected heat treatment (also referred to herein as the "surface treatment") is performed and the substrates are bonded. Next, a portion of the donor substrate, referred to herein as the "remainder", is removed by mechanical thinning such as abrading and polishing so that transferred layer 20 (e.g., the portion of the donor substrate that is not removed) remains bonded to the receiver substrate.

Figure 2A:
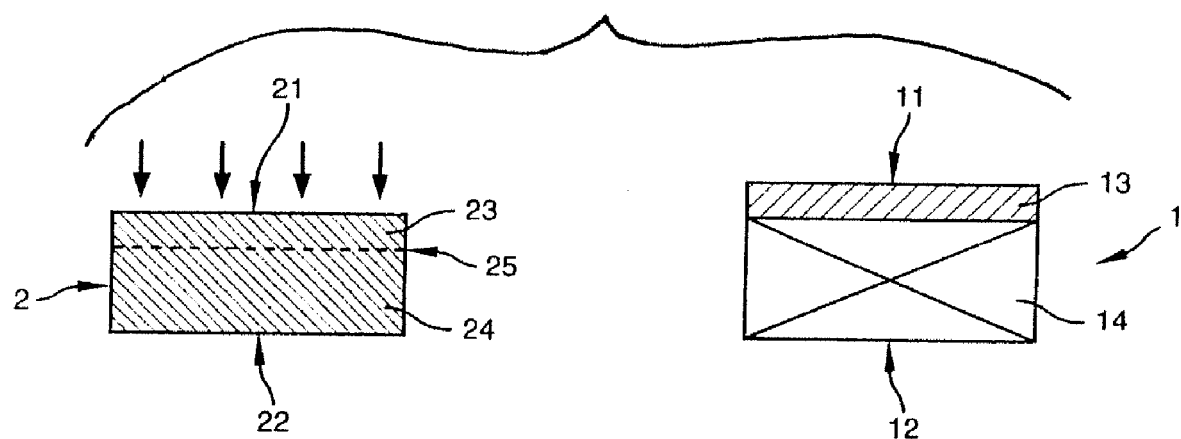
FIGS. 2A to 2C, 3A to 3D, and 4A to 4C illustrate respectively three variant implementations of the invention.
Figure 2B:
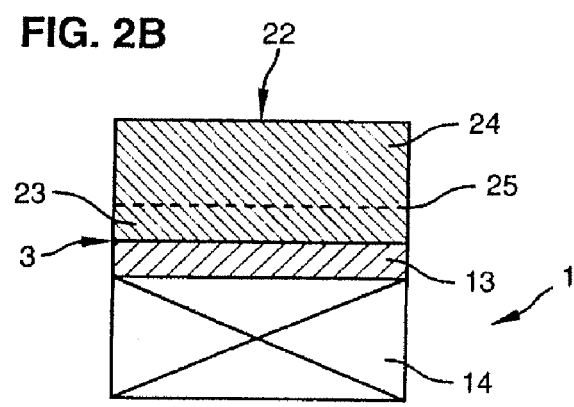
Figure 2C:
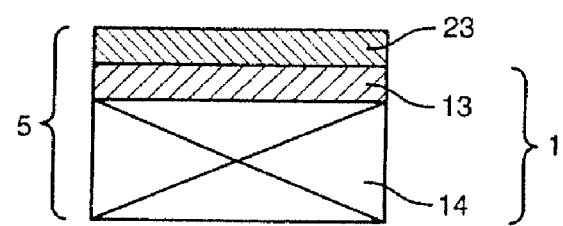

FIGS. 2A to 2C illustrate another preferred embodiment in which donor substrate 2 includes zone of weakness 25, which defines transfer layer 23 and remainder portion 24. Zone of weakness 25 can be formed, e.g., by implanting atomic species, e.g. hydrogen ions, using methods known under the name SMART-CUT®. When so formed, the selected heat treatment cannot be performed on the donor substrate prior to bonding to avoid the risk of causing bubbles at front face 21 (due to the implanted atomic species). The selected heat treatment can only be performed on semiconductor layer 13 which covers the receiver substrate 1 (or, equivalently, extends along the front face of the receiver substrate). Layer 13, e.g. of silicon, may comprise a fine surface layer of native oxide.

After surface treatment and direct bonding of substrates 1 and 2, remainder 24 of the donor substrate 2 is removed by applying mechanical, chemical, and/or thermal stresses in accordance with the techniques commonly used in implementing the SMART-CUT® methods. Resulting hybrid substrate 5, illustrated in FIG. 2, comprises semiconductor layers 13 and 23 of and layer 14 of the donor substrate 1.

Alternatively, zone of weakness 25 could comprise a porous layer fabricated according to methods known under the trademark ELTRAN. Also, donor substrate 2 may optionally be treated using the above-mentioned "HF last" method, or some other technique enabling a hydrophobic or hydrophilic surface to be obtained. The donor substrate can comprise a non-semiconducting layer on its front face.

Figure 3A:
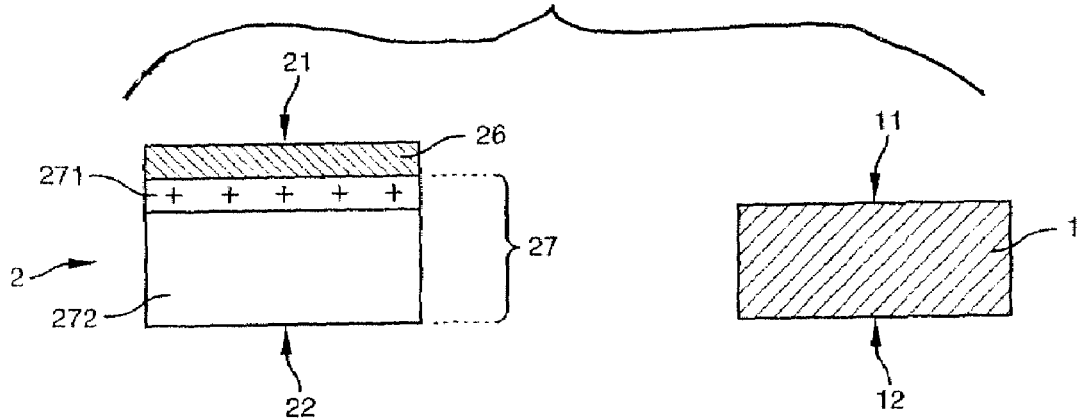
Figure 3B:
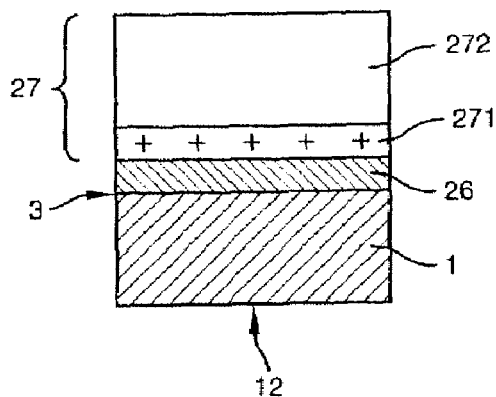
Figure 3C:
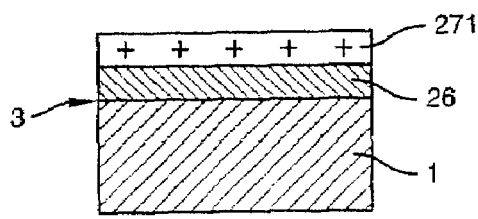
Figure 3D:
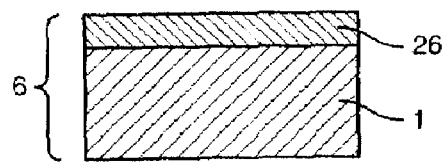

FIGS. 3A to 3C illustrate another preferred embodiment where receiver substrate 1 is similar to that described in connection with FIG. 1A. Donor substrate 2, of semiconductor-on-insulator type, comprises two semiconductor layers 26 and 272 and interposed insulating layer 271. FIG. 3B illustrates the results of the performing the selected heat treatment and bonding according to the invention, Next, remainder 27 of the donor substrate is removed in two stages. The first stage, illustrated in FIG. 3C, comprises mechanically removing layer 272, by abrading and then polishing. The second stage, illustrated in FIG. 3CD comprises removing insulating 271, e.g. by chemical etching. Resulting hybrid substrate 6 comprises transferred layer 26 bonded to receiver substrate 1. Other removal techniques can also be used depending on the nature of the donor substrate 2.

Figure 4A:
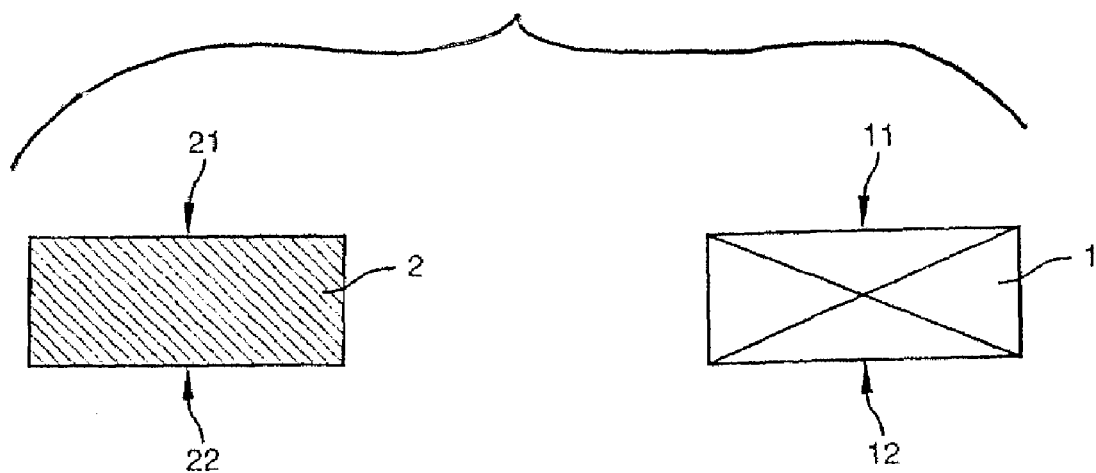
Figure 4B:
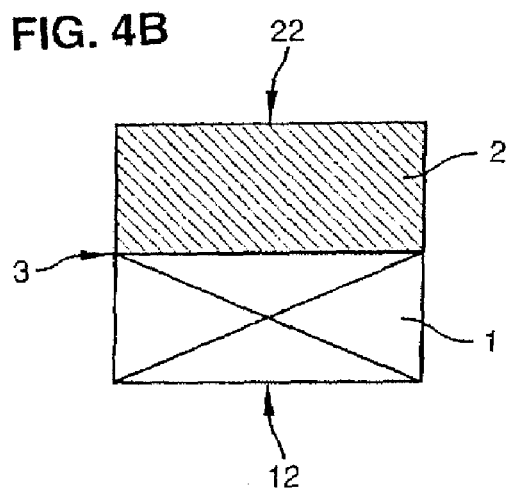
Figure 4C:
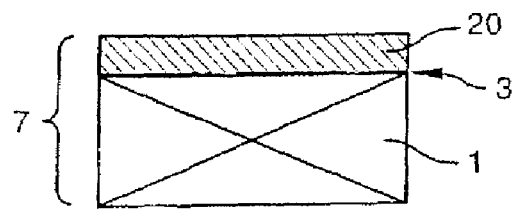

Finally, FIGS. 4A to 4C illustrate another preferred embodiment of the invention. Receiver substrate 1 is a single layer of a non-semiconducting material, while donor substrate 2 is a single layer of a semiconducting material similar to that described in connection with FIG. 1A. The selected heat treatment prior to bonding is, in accordance with the invention, applied only to donor substrate 2 and not to receiver substrate 1. FIG. 4B illustrates that, next, the bonding faces of the two substrates are brought into intimate contact, after which an optional consolidating (i.e., heat treatment) anneal can be performed. FIG. 4C illustrates that the remainder of donor substrate 2 is then removed so that hybrid substrate 7 comprises transferred semiconductor layer 20 bonded to non-semiconducting receiver substrate 1.

In either embodiment, it is helpful for the method to further comprise providing a thin insulating surface layer upon at least part of the surface of the substrate or substrates comprising a semiconductor material.

In alternative embodiments, the bonding faces of the donor and/or the receiver substrates can be subjected to plasma activation treatment for improving bonding strength. Also, if one bonding face was not subject to the selected thermal treatment, conventional hydrophilic or hydrophobic surface treatments, for example treatment of the RCA type, can be applied to that bonding face. In embodiments where the remainder of the donor substrate is detached along a zone of weakness, the resulting free surface after detaching can be slightly damaged. It can be advantageous to subject the final hybrid substrate to finishing by smoothing heat treatment, or by sacrificial oxidation, or by polishing. Further, known cleaning techniques can be applied to the substrates prior to performing the methods of the invention.

The sequence of the various steps of an alternative method will now be briefly described. As may be seen in FIG. 5, a "donor" substrate 100 comprises two opposed faces 110 and 111, called "front" and "rear" faces respectively.

As shown in FIG. 6, the donor substrate 100 then undergoes an implantation of atomic/or ionic species so as to form therein a weakened zone 112, which forms the boundary between a layer 113 called an "active" layer 113 and the remainder 114 of this substrate. Advantageously, this implantation is carried out through a sacrificial insulation layer 103, for example a layer of silicon dioxide ($SiO_2$), deposited on the front face 110 of the substrate 100. This insulation layer 103 is then removed, as shown in FIG. 7.

The donor substrate 100 and a "receiver" substrate 200 then undergo a "prebonding preparation" treatment, which will be explained in detail later (see FIG. 8). The receiver substrate 200 comprises two opposed faces 120 and 121, called "front" and "rear" faces respectively. Next, the front face 120 of the receiver substrate 200 is applied by direct bonding to the front face 110 of the donor substrate 1 (see FIG. 9). The bonding interface has the numerical reference 104. After a treatment to strengthen the bonding, the remainder 114 of the donor substrate 100 is detached, as shown in FIG. 10, so as to transfer the active layer 113 onto the receiver substrate 200 and obtain a hybrid substrate, with the reference 105.

The various steps will now be described in greater detail. The donor substrate 100 and receiver substrate 200 may or may not consist of semiconductor materials. In general, the material constituting the donor substrate 100 will be chosen from crystalline materials in which it is possible to create a dense distribution of cavities, by implanting atomic and/or ion species, followed by a thermal annealing step. As an example, the material constituting the donor substrate 1 may be chosen from silicon (Si), (110) silicon, (100) silicon, silicon-germanium (SiGe), germanium (Ge), silicon carbide (SiC) and gallium nitride (GaN).

The receiver substrate 200 consists of any crystalline or noncrystalline material, for example silicon (Si), (110) silicon, (100) silicon or silicon carbide (SiC), preferably single-crystal silicon or polycrystalline silicon carbide, but also polycrystalline silicon. It may be a semiconductor or an insulator material. Two particular applications of the invention consist in forming a DSB-type substrate in which the donor substrate 100 and the receiver substrate 200 are both made of silicon, preferably single-crystal silicon and of different crystalline orientations (for example (100), (110) or (111)), or in forming an SopSiC-type substrate in which the donor substrate 100 is made of silicon (preferably single-crystal silicon) and the receiver substrate 200 is made of polycrystalline silicon carbide. It should be noted that the donor and receiver substrates may also be multilayer substrates. However, in this case it is necessary for the layer of material constituting the front faces 110 and 120 of the substrates 100 and 200 to meet the aforementioned specifications.

The step of implanting atomic and/or ionic species is carried out by selecting the implanted species, their dose and their implantation energy so that the defects induced by these species within the donor substrate 100 allow the remainder 114 to be subsequently detached (see FIG. 10) but do not develop sufficiently, during the prebonding preparation heat treatment shown in FIG. 8, to deform the front face 110 to be bonded or prevent the subsequent bonding shown in FIG. 9. As examples of species that can be implanted, mention may be made of hydrogen (H), helium (He), fluorine (F), neon (Ne), argon (Ar), krypton (Kr) and xenon (Xe). These species are particularly appropriate for implantation in a silicon substrate 100.

The choice of these species, their dose and their implantation energy will be made so as to avoid the phenomenon of surface bubbling that is typically obtained when a material, implanted in standard fashion, is annealed. In general, it is also possible to carry out a co-implantation operation, the surface of the substrate being bombarded in succession with different species. It is advantageous to use, for example, a first implantation of helium followed by an implantation of $H^+$ ions. Likewise, the nature of the species, their dose and their implantation energy are chosen in such a way that the bubbling of the implanted species is limited. Thus, whether this be simple implantation or co-implantation, the implantation energies and doses of the aforementioned species will be chosen between 20 and 500 keV and between $1\times10^{14}$ at/$cm^2$ and $1\times10^{17}$ at/$cm^2$.

As an example, helium atoms are implanted into the substrate with an energy of around 30 to 200 keV and with a dose being within the $5\times10^{16}$ to $1\times10^{17}$ at/$cm^2$ range. In the case of argon atoms, the applied energy is around 200 to 500 keV and the implantation dose around $1\times10^{16}$ to $5\times10^{16}$ at/$cm^2$. In the case of co-implantation, it is possible for example to use hydrogen co-implanted with fluorine or hydrogen co-implanted with helium. In the case of hydrogen/fluorine co-implantation, the hydrogen is implanted with an energy between 20 and 50 keV and a dose between $1\times10^{15}$ and $5\times10^{16}$ $H^+/cm^2$, whereas the fluorine is implanted with an energy between 150 and 200 keV and for implantation doses of $1\times10^{14}$ to $1\times10^{16}$ $F^+/cm^2$. In the case of hydrogen/helium co-implantation, the helium is implanted with an energy between 70 and 90 keV and a dose between $1\times10^{16}$ and $6\times10^{16}$ $He^+/cm^2$, whereas the hydrogen is implanted with an energy between 70 and 90 keV for implantation doses of $1\times10^{15}$ to $6\times10^{15}$ $H^+/cm^2$.

As regards the implantation, the reader may refer to the literature on the SMART-CUT® process. Preferably, and as shown in FIG. 6, the implantation takes place through the front face 110. Also preferably, all the implantations are carried out through a sacrificial oxide layer 103. This oxide layer 103 may be formed thermally (for example from $SiO_2$ in the case of a silicon substrate) or deposited by deposition techniques well known to those skilled in the art, such as chemical vapor deposition (CVD) at atmospheric pressure or low-pressure chemical vapor deposition (LPCVD). These techniques will not described here in detail. The oxide 103 may also be native oxide.

The sacrificial oxide 103 is then removed after the implantation, for example by immersing the substrate 100 in a dilute hydrofluoric acid (HF) solution or by placing it in an atmosphere of hydrofluoric acid vapor. The removal of the sacrificial oxide is preferably followed by an RCA-type cleaning operation in order to protect the front face 10 from contaminating particles. The treatment using a chemical bath called RCA-clean consists in treating the front face 110 in succession with:

a first bath of a solution known as SC1 (Standard Clean 1) which comprises a mixture of ammonium hydroxide ($NH_4OH$), hydrogen peroxide ($H_2O_2$) and deionized water; and a second bath of a solution known as SC2 (Standard Clean 2), which comprises a mixture of hydrochloric acid (HCl), hydrogen peroxide ($H_2O_2$) and deionized water.

The prebonding preparation treatment shown in FIG. 8 consists in subjecting at least one of the faces to be bonded, 110 or 120, to a heat treatment at a temperature between 800° C. and 1200° C. and preferably between 900 and 1200° C. in a gaseous atmosphere comprising hydrogen and/or argon, but not oxygen. The gaseous atmosphere may therefore be chosen to comprise: exclusively hydrogen, or exclusively argon, or a mixture of these two gases, or even one or other or both of them combined with another gas, excluding oxygen. The duration of the treatment is at least 30 seconds, but preferably does not exceed a few minutes. The effect of the hydrogen and/or argon is to remove the native oxide possibly present on the face(s) thus treated, to passivate these surfaces by means of hydrogen atoms, and also to obtain very low surface roughness.

This prebonding preparation treatment also has the effect of making the treated surfaces hydrophobic. This effect was demonstrated by measuring the contact angle of a drop of water, giving a value of 80°. This value is much higher than the value obtained after a treatment of the "HF-last" type, which is typically 70° (see the article by Y. Bäcklünd, Karin Hermasson and L. Smith, "*Bond-strength measurements related to silicon surface Hydrophilicity*", J. Electrochem. Soc., Vol. 1398, No. 8, 1992). The advantage of this treatment is that no species is adsorbed on the treated surface. Since the hydrogen atom is very small, when it desorbs, to allow the creation of covalent bonds between the facing front faces 110 and 120, it does not remain trapped at the interface but defuses into the material, without generating outgassing defects. In addition, this treatment is of the dry type, unlike for example the aforementioned HF-last treatment. It is therefore simpler to implement it as it requires no drying. Finally, this prebonding preparation treatment has the effect that the implanted ions, for example the $He^+$ ions, are trapped and stabilized in the microcavities that form and expand. This results in the coalescence of the microcavities and in the embrittlement of the implanted material in the zone containing the microcavities. However, the implantation conditions are chosen in such a way that the aforementioned coalescence phenomenon does not lead to the detachment of the layer 113 from the remainder 114.

The prebonding preparation treatment can be carried out in a chamber for high-temperature annealing in a controlled atmosphere, for example a single-wafer RTP (rapid thermal process) furnace or else an epitaxial growth furnace. The use of a conventional furnace, in which the substrates are treated in batches, may also be envisioned.

After the aforementioned treatment, the front faces 110 and 120 must be bonded together very rapidly, so as to minimize the risks of contamination by the ambient atmosphere. This bonding step is shown in FIG. 9. Advantageously, it is also possible to store the treated substrates in a chamber having a controlled atmosphere containing only an inert gas, typically argon or nitrogen. Such a treatment makes it possible to extend the hold time, i.e. the time before the donor substrate 100 and receiver substrate 200 are bonded to each other. It has also been noticed that the surfaces that have undergone the prebonding preparation treatment were much less reactive than surfaces prepared by the aforementioned HF-last process. This reduces the contamination of these surfaces with particles. Industrialization is thereby simplified.

The direct bonding step shown in FIG. 9 corresponds to bringing the respective front faces 110 and 120 of the donor 100 and receiver 200 substrates into intimate contact with each other, that is to say bonding by molecular adhesion. This bonding step is followed by a treatment for strengthening the bonding, carried out in the form of a long heat treatment, that is to say for a time of at least two hours, at a temperature of 1100° C. or higher. As shown in FIG. 110, detachment of the donor substrate 100 from the remainder 114 then takes place. This detachment is purely mechanical. A "purely" mechanical detachment is initiated by a mechanical action, for example by running a tool, such as a blade, along the weakened zone 112 from one side of the substrate, or by applying an air jet or water jet at this point. While this type of purely mechanical detachment is being carried out, the structure may also be rotated so as to facilitate the detachment.

EXAMPLES

Non-limiting examples of how to implement the invention are now presented:

Example 1A

Direct Bonding Silicon Substrates

Donor substrate 2 and receiver substrate 1 were selected to be (100) silicon substrates of 300 millimeter (mm) diameter. The numbers of particles on the front faces of the substrates were measured by a laser surface scanner device (e.g., as sold under the trademark Surfscan SP1 by supplier KLA-Tencor) both before and after the following preparation. After the first particle measurement, both substrates were prepared according to the invention as follows: first, cleaning in baths of ozone and SC1 solution and rinsing in deionized water, and second, performing the selected heat treatment at a temperature of 1060° C. for a duration of 3 min in an atmosphere containing 100% hydrogen. After this preparation, the second particle measurement revealed that fewer than 50 additional particles with a size of 0.13 μm were on the substrate surfaces.

Next, the front faces of the donor and receiver substrates were brought into intimate contact and directly bonded, and the bonded substrates were subject to a consolidating anneal at a temperature about 1100° C. for about 2 hours. After bonding and annealing, bond quality was measured by acoustic microscopy, and no bonding defects were detected.

Example 1B

A Prior Art Method

Silicon substrates were prepared as in Example 1A, except that, instead of performing the selected heat treatment, "HF last" treatment was performed according to the prior art. After this preparation, more than 800 additional particles were found on the substrate surfaces.

Next, the donor and receiver substrates were directly bonding and annealed as in Example 1A. Bond quality was measured by acoustic microscopy, and bonding defects were detected.

Comparison of Examples 1A and 1B demonstrate that bonds formed according to the invention have a higher quality than bonds formed according to the prior art.

Example 2

Analysis of Hydrophobic Bonding after Various Types of Pre-Consolidation or Consolidation Thermal Annealing Four pairs of silicon substrates were bonded as described in Example 1A, except that four different consolidating heat treatments (also referred to as "(thermal) annealing") were performed.

a) a single step with temperature/duration of 200° C./2 h;

b) a first step with temperature/duration of 350° C./2 h; then a temperature ramp-up to 500° C. at 5° C./min; then a second step with temperature/duration of 500° C./1 h;

c) a first step with temperature/duration of 350° C./2 h; then a temperature ramp-up to 700° C. at 5° C./min; then a second step with temperature/duration of 700° C./1 h; and d) a first annealing step with temperature/duration of 350° C./2 h; then a temperature ramp-up to 900° C. at 5° C./min; then a second step with temperature/duration of 900° C./1 h.

Bonds between the substrates were observed using an acoustic microscopic both before and after thermal annealing step(s). No bubbles were observed either before or after any of the four annealing steps.

Next, four more pairs of silicon were bonded and annealed as above, except that the selected heat treatment was at about 1100° C. for 60 s in an atmosphere of 20% hydrogen and 80% oxygen. Again, no bubbles were observed either before or after any of the four annealing steps.

Example 3

SOI-Type of Donor Wafers

Four SOI-type donor substrates each including a silicon surface layer, an oxide intermediate layer, and a silicon support layer were bonded to four receiver substrates after a selected heat treatment as described in Example 1. Then, the silicon support layers of the donor wafers were removed by polishing and applying tetramethylammonium hydroxide (TMAH), and the oxide intermediate layers of the donor wafers were removed by chemical etching using hydrofluoric acid (HF). Accordingly, the four hybrid substrates included the silicon surface layers originating from the SOI-type donor wafers bonded to the receiver substrates.

Next, the four hybrid wafers were subject to the four consolidating annealing described in Example 2. Again, no bubbles were observed either before or after any of the four annealing steps.

Example 4

Substrate with a Zone of Weakness

Silicon donor substrates were selected with a surface native oxide layer a few nanometers thick or a deposited oxide less than 50 nm thick. They were prepared by implanting hydrogen ions at a density of $5 \times 10^{16}$ $H^+/cm^2$ with an energy of 60 kiloelectron volts (keV), thus creating a zone of weakness. These donor substrates were not subjected to the selected heat treatment (to avoid splitting at the zone of weakness). However, silicon receiver substrates were subjected to the selected heat treatment in accordance with the invention.

Next, the front faces of the donor and receiver substrates were directly bonded, and the bonded substrates were then subjected to pre-consolidation annealing at about 200° C. Finally, the remainder of the donor substrate was detached along the zone of weakness by applying thermal stresses, e.g., treatment at a temperature of about 400° C. to about 600° C. for a duration of about 2 h to about 8 h. The final substrate was then subjected to a finishing step by smoothing heat treatment, by sacrificial oxidation, and/or by polishing.

Bond quality was then measured by acoustic microscopy, and no bonding defects, e.g., no bubbles, were detected.

Example 5

Silicon/Silicon DSB-Type Substrate

A (110) Si silicon substrate covered with a silicon oxide ($SiO_2$) layer underwent an implantation with helium ions ($He^+$) with a dose of slightly less than $1 \times 10^{17}$ $He^+/cm^2$ and an implantation energy of 50 keV. The silicon oxide $SiO_2$ formed was then removed by treatment in a hydrofluoric acid (HF) solution followed by cleaning of the aforementioned RCA-clean type. This silicon donor substrate and a receiver substrate, also made of silicon but of (100) crystalline orientation, then underwent the prebonding preparation treatment in a gaseous atmosphere comprising hydrogen and argon for a time of about 4 minutes at a temperature of 1050° C.

The two substrates 100 and 200 were then bonded together via their respective front faces and underwent a heat treatment for 2 hours at 1100° C. in order to strengthen the bonding. Finally, the donor substrate was detached from the remainder, purely mechanically by inserting a blade. A substrate of the silicon/silicon DSB type was thus able to be obtained.

This product thus had a very high-quality bonding interface necessary for the production of future components.

Example 6

Silicon-On-Polycrystalline Silicon Carbide Substrates

A (100) Si silicon substrate covered with a silicon oxide ($SiO_2$) layer underwent a hydrogen/fluorine co-implantation. The fluorine was implanted with a dose of about $1 \times 10^{15}$ $F^+/cm^2$ and an implantation energy of 180 keV, whereas the hydrogen was implanted with a dose of about $4 \times 10^{16}$ $H^+/cm^2$ and an implantation energy of 30 keV. The silicon oxide $SiO_2$ formed was then removed by treatment in a hydrofluoric acid (HF) solution followed by cleaning of the aforementioned RCA-clean type. This silicon donor substrate and a receiver substrate, made of polycrystalline silicon carbide (pSiC), then underwent the prebonding preparation treatment in a gaseous atmosphere comprising hydrogen for a time of about 5 minutes at a temperature 800° C.

The two substrates 100 and 200 were bonded together via their respective front faces and underwent a heat treatment for 3 hours at 1000° C. in order to strengthen the bonding. Finally, the donor substrate was detached from the remainder purely mechanically, by injecting a fluid jet. A substrate of the SopSiC (silicon-on-polycrystalline silicon carbide) type was thus able to be obtained with a very high-quality bonding interface.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

A number of references are cited herein, the entire disclosures of which are incorporated herein, in their entirety, by reference for all purposes. Further, none of the cited references, regardless of how characterized above, is admitted as prior to the invention of the subject matter claimed herein.

What is claimed is:

1. A method for forming a hybrid substrate by direct bonding of donor and receiver substrates suitable for use in electronics, optics, or optoelectronics, each substrate comprising a respective front face and surface, with the front face of the receiver substrate comprising a semiconductor material at, or in proximity to, the surface, and the donor substrate including a zone of weakness that defines a layer to be transferred from a remainder of the donor substrate, wherein the method comprises:

preparing the substrate surfaces by exposing at least the surface of the receiver substrate to a temperature from about 900° C. to about 1200° C. in an inert atmosphere for a duration of at least 30 sec;

directly bonding together the front faces of the prepared substrates to form a composite substrate;

heat treating the composite substrate to increase bonding strength between the front surfaces of the donor and receiver substrates; and transferring the layer from the donor substrate by detaching the remainder of the donor substrate at the zone of weakness to form the hybrid substrate.

2. The method of claim 1 wherein the donor and receiver substrates are made of crystalline materials, the transferred layer is an active layer and the inert atmosphere comprises hydrogen, argon or mixtures thereof.

3. The method of claim 1 wherein the zone of weakness is provided by implanting at least one category of atomic or ionic species into the donor substrate with the nature, implantation dose and implantation energy of the atomic or ionic species being chosen so that defects induced by these species within the donor substrate allow the remainder of the donor substrate to be subsequently detached but do not develop sufficiently during the heat treating step to prevent the subsequent bonding or to deform the front face of the donor substrate.

4. The method of claim 3 wherein the remainder of the donor substrate is detached by a purely mechanical action.

5. The method of claim 1, wherein the heat treating is carried out in a rapid thermal annealing (RTP) furnace.

6. The method of claim 1, wherein the heat treating is carried out by a long heat treatment for at least 2 hours at a temperature of 1100° C. or higher.

7. The method of claim 1, wherein the front faces of both substrates comprise semiconductor materials, and wherein the preparing further comprises preparing both substrates by the recited temperature exposure.

8. The method of claim 1, which further comprises, prior to bonding, storing temporarily the prepared substrates in an inert atmosphere.

9. The method of claim 1, which further comprises, subsequent to bonding, performing a bonding consolidation heat treatment by exposing the bonded substrates to a temperature in the range of about 200° C. to about 1200° C.

10. The method of claim 9, where the consolidation heat treatment is performed for a duration of at least about one hour or for a duration of less than about three hours.

11. The method of claim 1, wherein the zone of weakness comprises a porous zone.

12. The method of claim 1, wherein the donor substrate is made of a material chosen from silicon, (110) silicon, (100) silicon, silicon-germanium, germanium, silicon carbide and gallium nitride.

13. The method of claim 1, wherein the receiver substrate is at least partly made of a material chosen from silicon, (110) silicon, (100) silicon and silicon carbide.

* * * * *